United States Patent
Kurita

[11] Patent Number: 6,073,260
[45] Date of Patent: Jun. 6, 2000

[54] INTEGRATED CIRCUIT

[75] Inventor: Toshiaki Kurita, Tokyo, Japan

[73] Assignee: Oki Electric Industry Co., Ltd., Tokyo, Japan

[21] Appl. No.: 09/038,748

[22] Filed: Mar. 12, 1998

[30] Foreign Application Priority Data

Mar. 24, 1997 [JP] Japan .................................. 9-070088

[51] Int. Cl.[7] .................................................. G01R 31/28
[52] U.S. Cl. .......................................................... 714/724
[58] Field of Search .................................. 714/724, 726, 714/727, 729, 815, 30

[56] References Cited

U.S. PATENT DOCUMENTS 5,394,404 2/1995 Uchida ..................................... 714/733
5,459,735 10/1995 Narimatsu ............................... 714/731
5,487,074 1/1996 Sullivan ................................... 714/727

*Primary Examiner*—Trinh L. Tu
*Attorney, Agent, or Firm*—Jones Volentine, LLP

[57] ABSTRACT

Test data TD, which are provided to a flipflop 11 of a scan flipflop 10-1 through a scan path 1S are latched with the timing of a clock signal CK that has been inverted at an inverter 12. An output signal S11 from the flipflop 11 is provided to a flipflop 14 via a selector 13, is latched at the flipflop 14 with the timing of the clock signal CK and is provided to a scan flipflop 10-2 at the succeeding stage through a scan path 3S. In this manner, since the timing with which the test data TD change and the timing with which the clock signal CK rises are offset by ½ of the clock cycle, a reliable scanning operation is achieved regardless of the length of the paths such as the scan path 1S and the like.

6 Claims, 6 Drawing Sheets

INTEGRATED CIRCUIT

BACKGROUND OF THE INVENTION

The present invention relates to an integrated circuit such as an application specific integrated circuit (hereafter referred to as "ASIC"), for instance, and in particular, it relates to a circuit that facilitates the testing of such integrated circuits.

The full scan design method is one of the design methods for facilitating the preparation of test patterns in an LSI tester for integrated circuits. Through this method, a shift register operation is achieved by connecting all the sequential circuits such as flipflops that are present inside the circuit. Thus, it becomes possible to create a test pattern that achieves a high rate of error detection by improving the visibility and controllability of all the elements inside the circuit.

In the full scan design method, first a circuit that is not provided with a scan path circuit is designed, and then this circuit is automatically converted to a full scan circuit by employing a scan-enable tool. Through this conversion, the non scan-enabled flipflops are all converted to flipflops provided with a scanning function and by connecting scan paths, a shift register operation becomes possible.

A more detailed explanation is given on the concept of this circuit design in reference to FIGS. 1 and 2. It is to be noted that FIG. 1 is a schematic block diagram of an ASIC which is not provided with a test circuit, and FIG. 2 is a schematic block diagram of an ASIC provided with a test circuit.

During the initial stage of the design, first, an ASIC which is not provided with a test circuit, as shown in FIG. 1, is designed. The ASIC in FIG. 1 is provided with a user logic circuit 1 to which an input signal IN is input. The input side of a flipflop 2 is connected to the output side of the user logic circuit 1. The input side of a user logic circuit 3 is connected to the output side of the flipflop 2, and the input side of a flipflop 4 is connected to the output side of the user logic circuit 3.

Moreover, the input side of a user logic circuit 5 is connected to the output side of the flipflop 4, and an output signal OUT is output at the output side of the user logic circuit 5. A common clock signal CK is provided to the flipflops 2 and 4, and the timing for inputting and outputting data is in synchronization with the clock signal CK.

Next, by converting the flipflops 2 and 4 in the ASIC shown in FIG. 1 to flipflops provided with a scanning function (hereafter referred to as scan flipflops) 2A and 4A respectively using a scan-enable tool, a shift register operation via a scan path circuit becomes possible. It is to be noted that the scan flipflops 2A and 4A are structured identically to each other, each provided with a scan input terminal SD and a mode selection terminal SE in addition to a data input terminal D. Also, in these flipflops, input data IN provided to the data input terminal D are used as an input signal when a mode signal MOD provided to the mode selection terminal SE is set to "normal mode," whereas scan data SD provided to the scan input terminal SD are used as an input signal when the mode signal MOD is set to "scan mode."

The scan flipflop 2A may be provided with, for instance, a selector 2a, with the input side of the selector 2a connected to the input data terminal D and the scan input terminal SD. In addition, the mode signal MOD from the mode selection terminal SE is provided to a control terminal of the selector 2a. When the mode signal MOD is set to "normal mode," the input data terminal D is selected by the selector 2a, whereas when the mode signal MOD is set to "scan mode," the scan input terminal SD is selected by the selector 2a. The input side of a flipflop 2b is connected to the output side of the selector 2a, with the output side of the flipflop 2b constituting the output terminal of the scan flipflop 2A. Moreover, the clock signal CK is provided to the clock terminal of the flipflop 2b.

At the output side of the user logic circuit 5 at the last stage, the input side of a selector 6, which is controlled by the mode signal MOD, is connected, and the output signal OUT is output to the output side of the selector 6.

Moreover, in the ASIC in FIG. 2, the input side of the user logic circuit 1 and the scan input terminal SD of the scan flipflop 2A are connected with each other through a scan path 1S. In addition, the output side of the scan flipflop 2A and the scan input terminal SD of the scan flipflop 4A are connected with each other through a scan path 3S. The output side of the scan flipflop 4A and the input side of the selector 6 are connected with each other through a scan path 5S.

In the ASIC in FIG. 2 structured as described above, normal operation is performed by a logic circuit constituted of the user logic circuit 1, the scan flipflop 2A, the user logic circuit 3, the scan flipflop 4A, the user logic circuit 5 and the selector 6, by setting the mode signal MOD to "normal mode."

By setting the mode signal MOD to "scan modes" on the other hand, a scan path that sequentially connects the scan path 1S, the scan flipflop 2A, the scan path 3S, the scan flipflop 4A, the scan path 5S and the selector 6 is constituted. Then, when test data TD are input as an input signal IN, the test data TD are sequentially sent to the scan flipflops 2A and 4A and the selector 6 in conformance to the clock signal CK, to be output as an output signal OUT. By comparing the output signal OUT to the test data TD, the operations of the scan flipflops 2A and 4A within the ASIC can be checked.

SUMMARY OF THE INVENTION

However, in the logic circuit design for an ASIC of the prior art, with the timing design completed before the scan-enable, if there is a skew present in the scan clock in the scan mode or if the flipflop element delay is smaller than the scan path delay, there is a concern in that a hold time error may occur in the scan paths 1S, 3S and 5S, as shown in FIG. 3, resulting in an unexpected, erroneous operation.

Thus, in order to prevent a hold time error described above from occurring, it is necessary to perform timing design again using the ASIC shown in FIG. 2 after the conversion processing is completed, which leads to an increase in the number of design steps.

A first object of the present invention, which has been completed after reflecting upon the problem of the prior art discussed above, is to provide a new and improved integrated circuit in which a timing error does not occur regardless of the lengths of the paths such as the scan path 1S, which may otherwise occur due to the automatic conversion of the flipflops employing a scan-enable tool.

Another object of the present invention is to provide a new and improved integrated circuit that does not require timing design to be performed again for a scan-enabled circuit even when automatic conversion of the flipflops is performed employing a scan-enable tool and, consequently, does not require the number of design steps to be increased.

In order to achieve the objects described above, according to the present invention, an integrated circuit such as an ASIC that comprises (1) logic circuits provided at N (N representing a plurality) stages, each of which performs a specific logic operation in correspondence to a provided input signal and outputs an output signal for a logic operation to be performed at the succeeding stage thereof, (2) N-1 means for latching having a scanning function provided between individual stages of the logic circuits provided at N stages, each of which is provided with an input signal for a preceding logic circuit and an output circuit of the logic circuit at the preceding stage, latches the output signal of the logic circuit at the preceding stage based upon a clock signal having two different levels, i.e., a first level and a second level, to output it as an output signal for the logic circuit at the succeeding stage in non-test mode and latches the input signal of the logic circuit at the preceding stage in conformance to the clock signal to output it in test mode, (3) a time hold correction circuit provided at each of the means for latching having a scanning function, that performs the latching operation and the output operation using different timing sequences and (4) a means for selection that is provided with the input signal for the logic circuit at the Nth stage and the output signal from the same logic circuit, selects the output signal for output in the non-test mode and selects the input signal for output in the test mode.

The time hold correction circuit is provided with (a) a first flipflop that latches the input signal for the logic circuit at the preceding stage when the clock signal has shifted from the first level to the second level, (b) a selector that is provided with the output signal of the logic circuit at the preceding stage and an output signal from the first flipflop, selects the output signal of the logic circuits at the preceding stage for output in the non-test mode and selects the output signal from the first flipflop for output in the test-mode and (c) a second flipflop that latches the output signal from the selector and outputs it as an output signal for the logic circuit at the succeeding stage when the clock signal has shifted from the second level to the first level.

In the structure described above, the following operation is performed.

In the normal mode which constitutes the non-test mode, an input signal is input to the input side of a logic circuit where a specific logic operation is performed and an output signal is output to achieve the logic operation at the succeeding stage. This output signal is selected at the selector of the means for latching having a scanning function, latched at the second flipflop in conformance to the clock signal and is provided to the input side of the logic circuit at the succeeding stage. Then, the output signal from the logic circuit at the last stage is selected by the means for selection and is output.

In the test mode, the input signal is latched at the first flipflop of a means for latching having a scanning function when the clock signal has shifted from the first level to the second level. Then, it is selected at the selector to be provided to the second flipflop, where it is latched when the clock signal has shifted from the second level to the first level. An output signal from the second flipflop is output as an input signal for the first flipflop of the means for latching having a scanning function at the succeeding stage. Then, an output signal from the means for latching having a scanning function at the last stage is selected by the means for selection and is output.

Alternatively, the time hold correction circuit may be constituted of (a) a delay circuit that delays the clock signal by a specific length of time and outputs a delayed clock signal, a first flipflop that latches the input signal for the logic circuits at the preceding stage based upon the delayed clock signal, (b) a selector that is provided with the output signal from the logic circuit at the preceding stage and an output signal from the first flipflop, selects the output signal from the logic circuit at the preceding stage for output in the non-test mode and selects the output signal from the first flipflop for output in the test mode, and (c) a second flipflop that latches an output signal from the selector in conformance to the clock signal and outputs it as an output signal for the logic circuit at the succeeding stage.

In the structure described above, the following operation is performed.

The operation performed in the normal mode has already been explained.

In the test mode, an input signal is latched at the first flipflop of a means for latching having a scanning function by the clock signal provided via the delay circuit. Then the output signal from the first flipflop is selected at the selector and is provided to the second flipflop where it is latched with the clock signal provided directly, without going through the delay circuit. The output signal from the second flipflop is output as an input signal for the first flipflop of the means for latching having a scanning function at the succeeding stage. Then, the output signal of the means for latching having a scanning function at the last stage is selected by the means for selection and is output.

Alternatively, the time hold correction circuit may be constituted of a (a) delay circuit that delays an input signal for the logic circuit at the preceding stage by a specific length of time and outputs a delayed input signal, (b) a selector that is provided with an output signal from the logic circuit at the preceding stage and the delayed input signal, selects the output signal from the logic circuit at the preceding stage for output in the non-test mode and selects the delayed input signal for output in the test mode and a flipflop that latches the output signal from the selector in conformance to the clock signal and outputs it as an output signal for the logic circuit at the succeeding stage.

In the structure described above, the following operation is performed.

The operation performed in the normal mode has already been explained.

In the test mode, an input signal is provided to the selector of a means for latching having a scanning function via the delay circuit, to be selected by the selector. The output signal from the selector is provided to the flipflop, where it is latched with the clock signal. An output signal from the flipflop is output as an input signal for the selector of the means for latching having a scanning function at the succeeding stage. Then, the output signal from the means for latching having a scanning function at the last stage is selected by the means for selection and is output.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

DETAILED DESCRIPTION OF THE PREFERRED EMBODIMENTS

The following is a detailed explanation of several preferred embodiments of integrated circuits constituted based upon the concept of the present invention in reference to the attached drawings. It is to be noted that the same reference numbers are assigned to components having practically identical structures and functions in this specification and the drawings, and repeated explanation thereof is omitted.

First Embodiment

Figure 2:
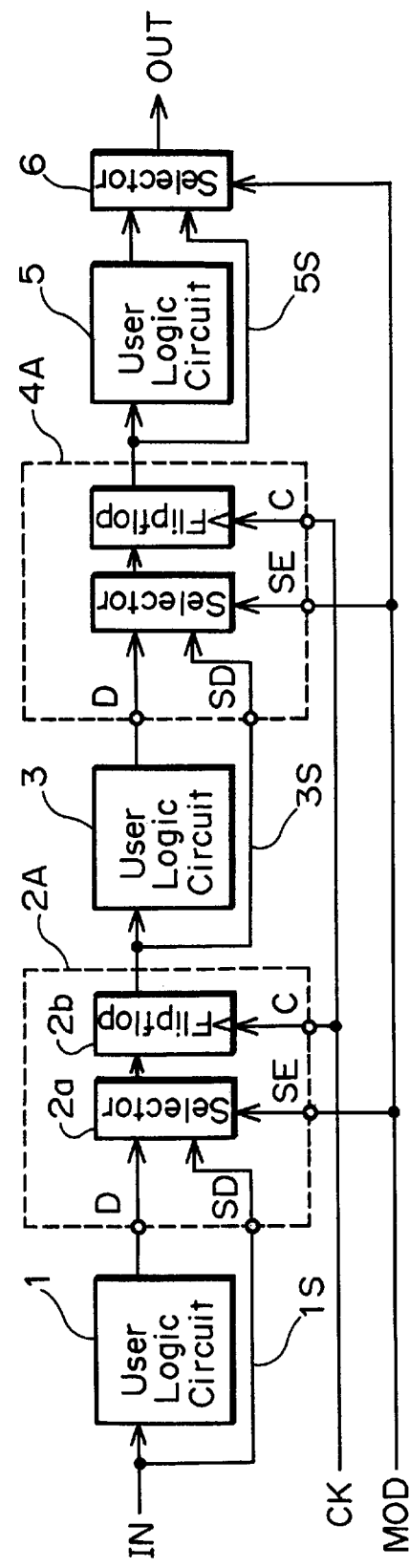
FIG. 2 is a schematic block diagram of a scan-enabled ASIC in the prior art.
Figure 4:
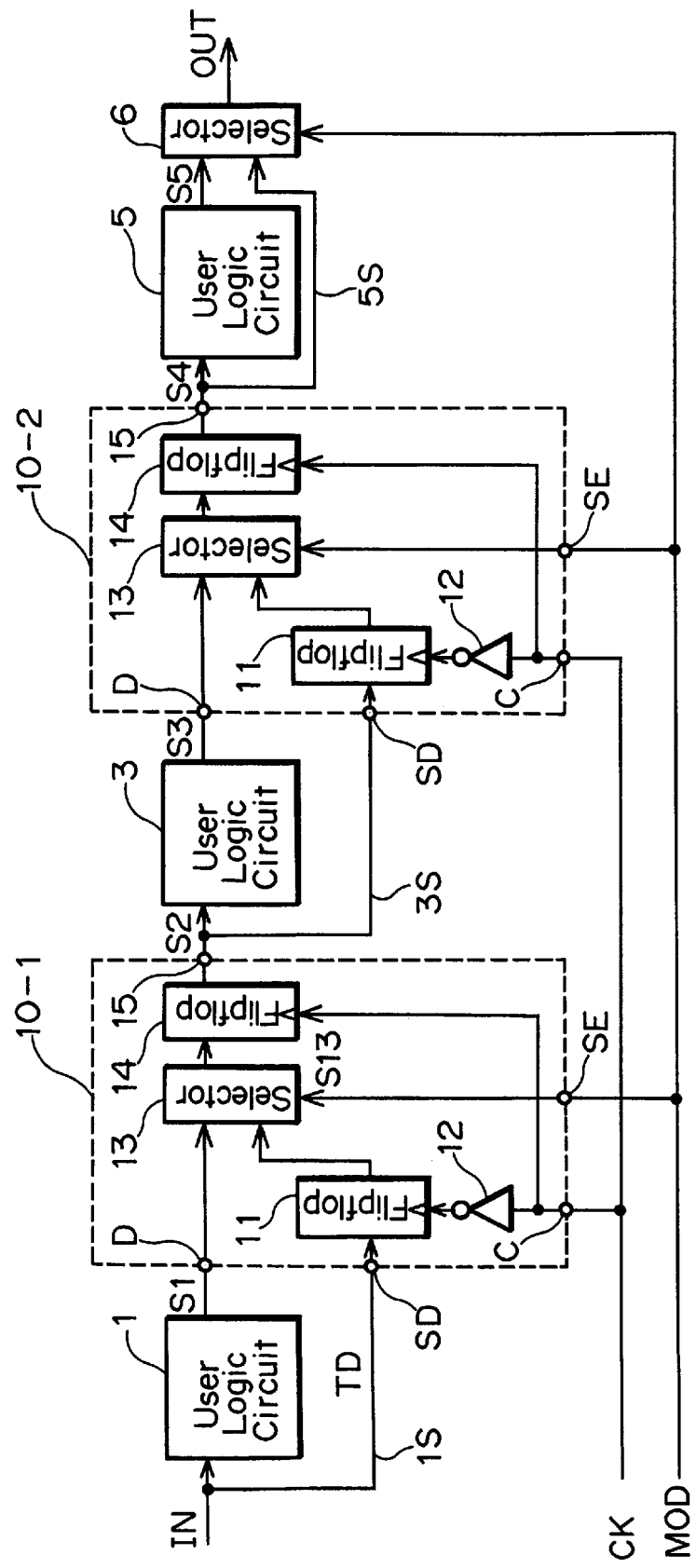
FIG. 4 is a schematic block diagram of the ASIC that represents a first embodiment of the present invention.

FIG. 4 is a schematic block diagram of the ASIC in a first embodiment of the present invention, with common reference numbers assigned to the elements that are identical to those used in the ASIC in the prior art shown in FIG. 2.

This ASIC is provided with, instead of the scan flipflops 2A and 4A in the ASIC shown in FIG. 2, scan flipflops 10-1 and 10-2 that are structured differently from the scan flipflops 2A and 4A. The other structural features are identical to those in the ASIC in FIG. 2.

The scan flipflops 10-1 and 10-2 are structured identically to each other. For instance, the scan flipflop 10-1 is provided with a data input terminal D to which an output signal S1 from a logic circuit (a user logic circuit, for instance) 1 at the preceding stage is provided, a scan input circuit SD, to which an input signal IN at the user logic circuit 1 is provided as test data TD, a clock terminal C to which a clock signal CK is provided and a mode selection terminal SE to which a mode signal MOD is provided.

The scan input terminal SD is connected to the data input side of a flipflop 11, whereas the clock terminal C is connected to the clock input side of the flipflop 11 via an inverter 12. The output side of the flipflop 11 is connected to a first input side of a selector 13 with a second input side of the selector 13 connected to the data input terminal D. The selector 13, based on the mode signal MOD provided to the mode selection terminal SE, selects the first input side when "scan mode" is set and selects the second input side when "normal mode" is set, for output to the output side. The output side of the selector 13 is connected to the data input side of a flipflop 14. The clock terminal C is connected to the clock input side of the flipflop 14, with the output side of the flipflop 14 connected to an output terminal 15.

Figure 5:
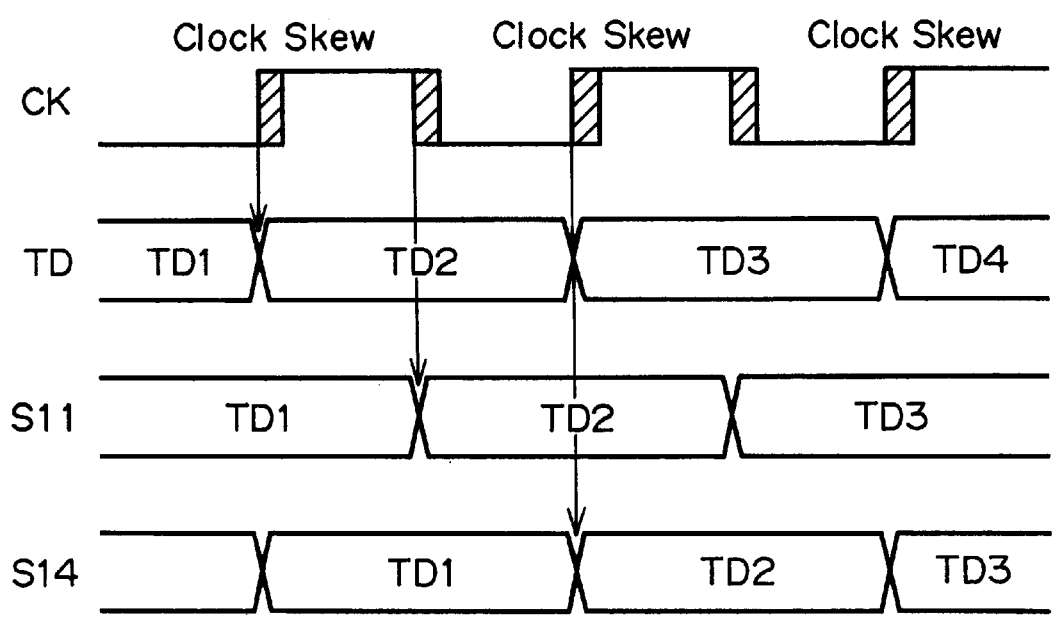
FIG. 5 is a timing chart illustrating the operations performed by the scan flipflops in FIG. 4.

FIG. 5 is a waveform diagram illustrating the operation of the scan flipflops 10-1 and 10-2 in FIG. 4. The following are separate explanations of the operations of the ASIC in FIG. 4 in (1) the normal mode and (2) the scan mode, in reference to FIG. 5.

(1) Normal Mode

First, the mode signal MOD is set to "normal mode." With this, signals S1 and S2 from the preceding stage provided to the data input terminals D of the scan flipflops 10-1 and 10-2 are switched to be selected by the selector 13 and output to the flipflop 14. In addition, at a means for selection (a selector, for instance) 6, switching is performed so that a signal S5 at the output side of the user logic circuit 5 is selected and output as an output signal OUT.

Next, a clock signal CK and an input signal IN, which is in synchronization with the clock signal CK, are sequentially provided.

At the user logic circuit 1, a specific type of logic processing is performed on the input signal IN, a signal S1 resulting from the processing is output to be provided to the scan flipflop 10-1. At the scan flipflop 10-1, the signal S1 that has been input is provided to the flipflop 14 via the selector 13, is latched in synchronization with the clock signal CK and is output as a signal S2 from the terminal 15.

At the user logic circuit 3, a specific type of logic processing is performed on the signal S2 provided by the scan flipflop 10-1, and a signal S3 resulting from the processing is output. At the scan flipflop 10-2, the signal S3 that has been input is provided to the flipflop 14 via the selector 13, is latched in synchronization with the clock signal CK and is output as a signal S4 from the terminal 15.

At the user logic circuit 5, a specific type of logic processing is performed on the signal S4 provided by the scan flipflop 10-2 and the signal S5 resulting from the processing is output. The signal S5 is output as an output signal OUT via the selector 6.

(2) Scan Mode

First, the mode signal MOD is set to "scan mode." With this, switching is performed so that the test data TD provided to the scan input terminal SD of either the scan flipflop 10-1 or the scan flipflop 10-2 are selected by the selector 13 to be output to the flipflop 14. In addition, at the selector 6, switching is performed so that the scan path 5S side is selected and is output as an output signal OUT.

Figure 3:
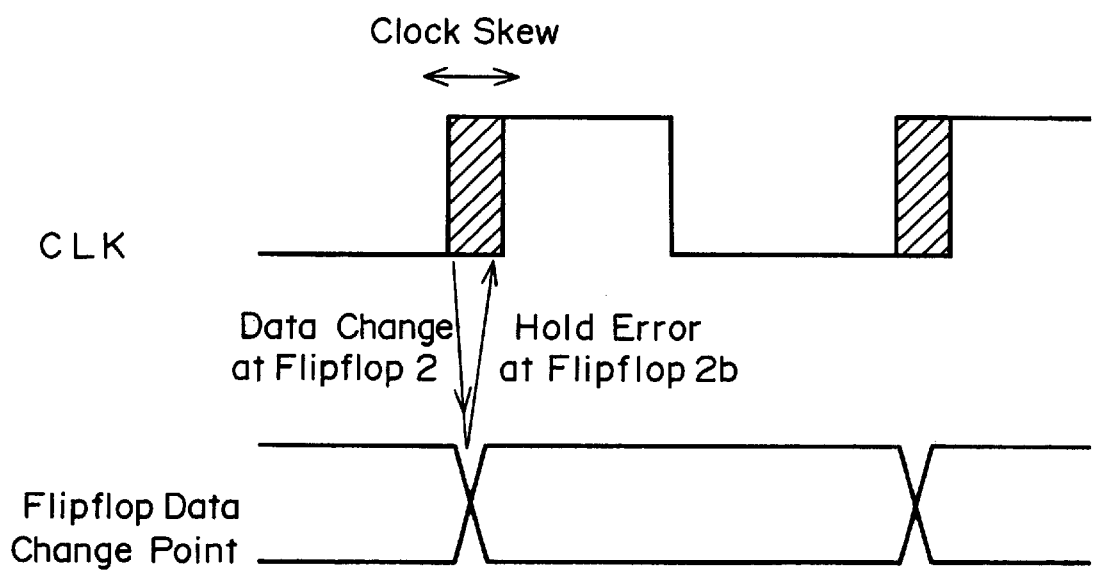
FIG. 3. is a timing chart illustrating the operation of the ASIC circuit shown in FIG. 2.

Next, the clock signal CK and the test data TD for testing constituting an input signal IN that is in synchronization with the clock signal CK are sequentially provided. The test data TD constitute a signal whose data change with the timing of the rise of the clock signal CK, as shown in FIG. 3.

The test data TD are input to the scan input terminal SD of the scan flipflop 10-1 via the scan path 1S. The clock signal CK is provided to the flipflop 11 of the scan flipflop 10-1 via the inverter 12, and with the timing of the fall of the clock signal CK, the test data TD are latched so that a signal S11 is provided to the input side of the selector 13. The signal S13 at the output side of the selector 13 is latched at the flipflop 14 with the timing of the next rise of the clock signal CK and is output as the signal S2. The signal S2 output from the scan flipflop 10-1 is provided to the scan input terminal SD of the scan flipflop 10-2 via the scan path 3S.

The operation performed at the scan flipflop 10-2 is identical to the operation performed at the scan flipflop 10-1. Then, a signal S4 output from the scan flipflop 10-2 is provided to the selector 6 via the scan path 5S, and is output as the output signal OUT via the selector 6. By comparing the output signal OUT with the test data TD that have been input, the operations at the scan flipflops 10-1 and 10-2 within the ASIC can be checked.

As has been explained, the ASIC in the first embodiment, which is provided with the inverter 12 at each of the scan flipflops 10 that inverts the clock signal CK and the flipflop 11 that latches the test data TD with the timing of the output signal from the inverter 12, an advantage is achieved in that the test data TD can be latched with a high degree of reliability, regardless of differences in the delay time achieved through the scan path 1S and the like.

Second Embodiment

Figure 6:
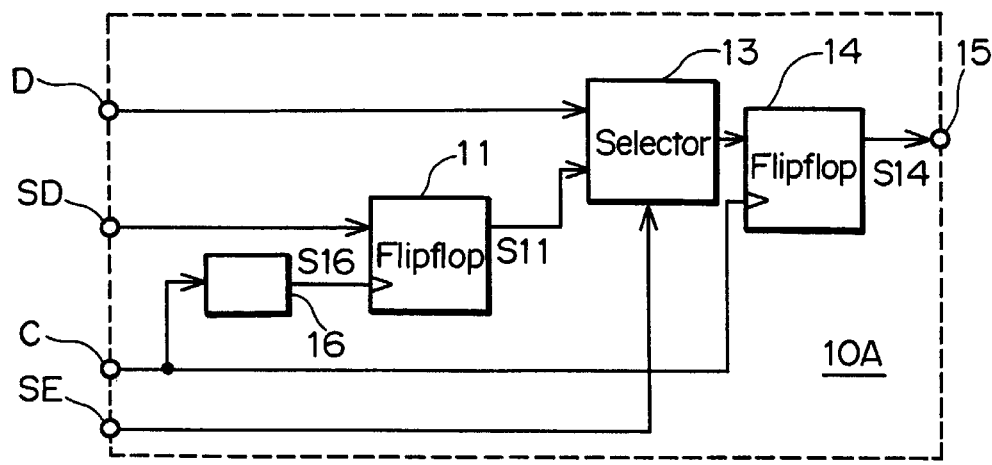
FIG. 6 is a schematic block diagram of the a scan flipflop that represents a second embodiment of the present invention.
Figure 7:
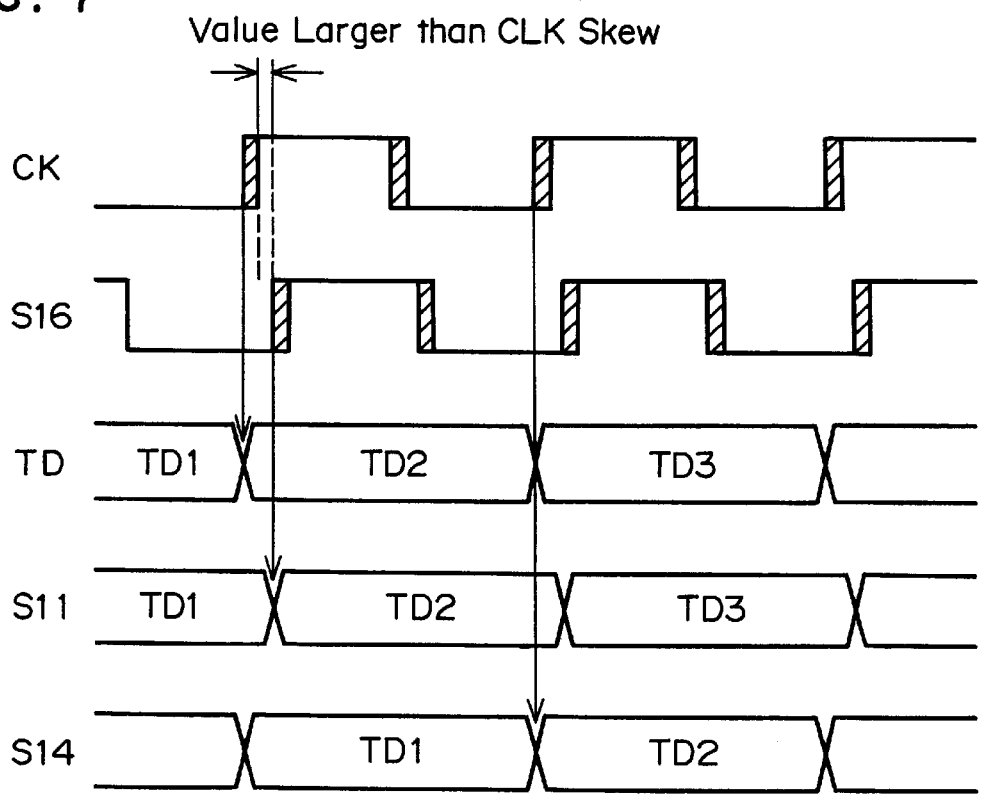
FIG. 7 is a timing chart illustrating the operation performed by the scan flipflop in FIG. 6.

FIGS. 6 and 7 illustrate a scan flipflop in the ASIC in a second embodiment of the present invention, with FIG. 6 presenting a block diagram of the scan flipflop and FIG. 7 presenting a waveform diagram illustrating the operation of the scan flipflop.

This scan flipflop 10A is employed in place of the scan flipflops 10 in the ASIC shown in FIG. 4. In the scan flipflop 10A in FIG. 6, a delay circuit 16 is provided in place of the inverters 12 in the scan flipflops 10 in FIG. 4. The delay circuit 16 may, for instance, connect inverters in series over an even number of stages, to generate a specific length of delay time. Other structural features are identical to those of the scan flipflops 10.

Figure 1:
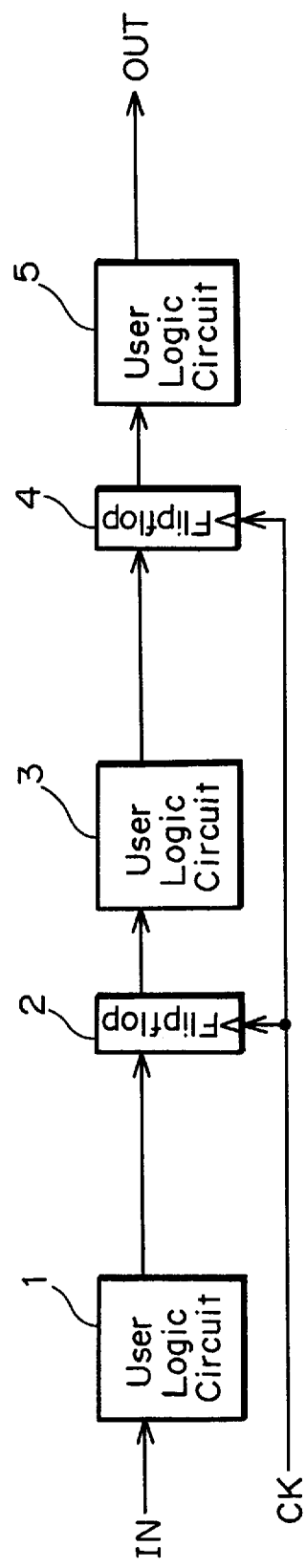
FIG. 1 schematic block diagram of a non scan-enabled ASIC in the prior art.

As shown in FIG. 7, in the scan flipflop 10A structured as described above, when the clock signal CK is provided to the clock terminal C and the test data TD which are in synchronization with the clock signal CK are provided to the scan input terminal SD, a delayed clock signal CK is output to the output side of the delay circuit 16 as a signal S16. The signal S16 is provided as the clock signal for the flipflop 11, and the test data TD are latched with the timing of the signal S16. The signal S11 at the output side of the flipflop 11 is provided to the input side of the flipflop 14 via the selector 13, and is latched at the flipflop 14 with the timing of the next rise of the clock signal CK to be output as a signal S14. Other operational features are identical to those of the ASIC shown in FIG. 1.

As has been explained, the ASIC in the second embodiment, which is provided with the delay circuit 16 that delays the clock signal CK 16 at its scan flipflop 10A and the flipflop 11 that latches the test data TD with the timing of the signal S16 at the output side of the delay circuit, an advantage is achieved in that the test data TD can be latched with a high degree of reliability regardless of differences in the length of delay time achieved through the scan path 1S and the like.

Third Embodiment

Figure 8:
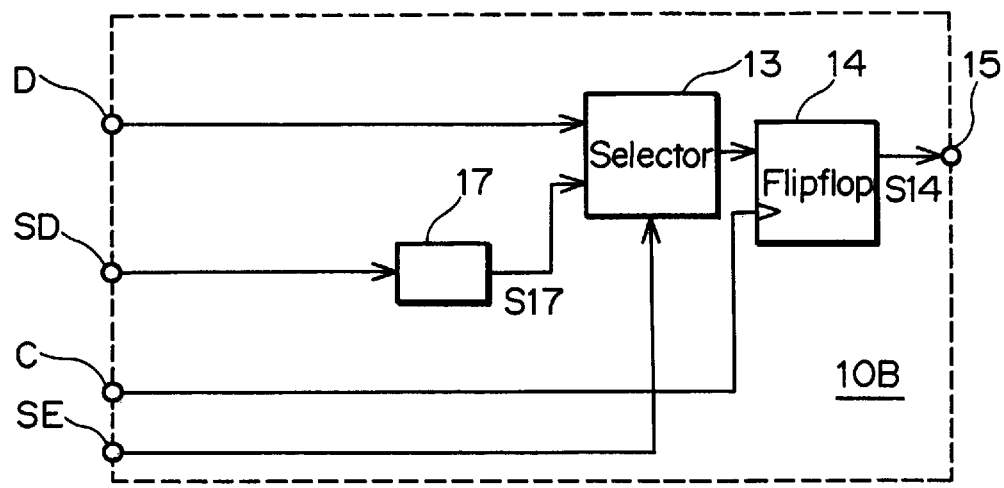
FIG. 8 is a schematic block diagram of a scan flipflop that represents a third embodiment of the present invention.
Figure 9:
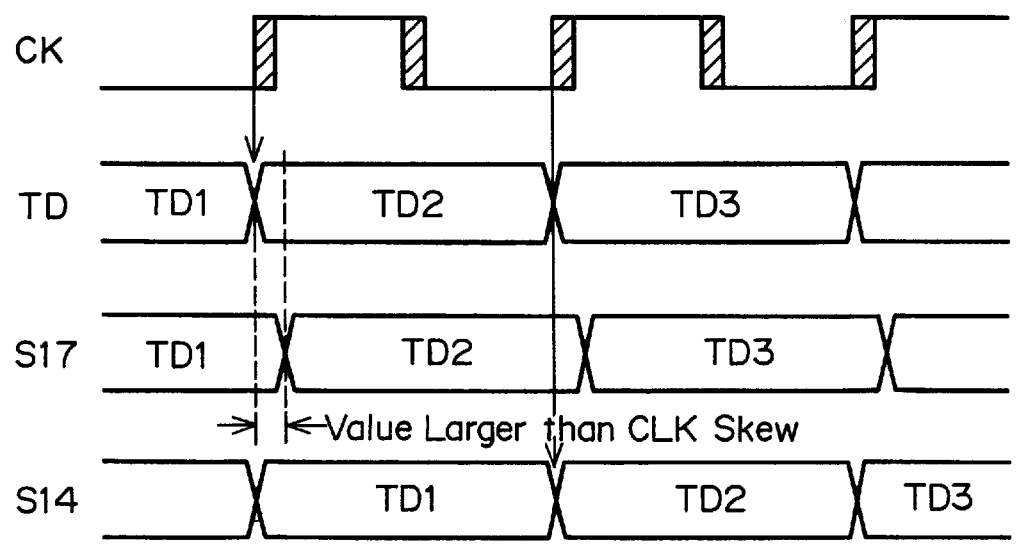
FIG. 9 is a timing chart illustrating the operation performed by the scan flipflop in FIG. 8.

FIGS. 8 and 9 illustrate a scan flipflop in the ASIC in a third embodiment of the present invention, with FIG. 8 presenting a block diagram of the scan flipflop and FIG. 9 presenting a waveform diagram illustrating the operation of the scan flipflop.

This scan flipflop 10B is employed in place of the scan flipflops 10 in the ASIC shown in FIG. 4. The scan flipflop 10B in FIG. 8 is provided with a delay circuit 17 in place of the flipflop 11 and the inverters 12 of the scan flipflops 10 shown in FIG. 4. The delay circuit 17 may, for instance, connect inverters in series over an even number of stages to generate a specific length of delay time, and the test data TD are delayed by a specific length of time by the delay circuit 17 so that they are provided to the input side of the selector 13 as a signal S17. Other structural features are identical to those of the scan flipflops 10.

In the scan flipflop 10B structured as described above, when the clock signal CK is provided to the clock terminal C and the test data TD that are in synchronization with the clock signal CK are provided to the scan input terminal SD, as shown in FIG. 9, the test data TD that have been delayed are output as the signal S17 to the output side of the delay circuit 17. This signal S17 is provided to the input side of the flipflop 14 via the selector 13, and is latched with the timing of the next rise of the clock signal CK at the flipflop 14 to be output as a signal S14. Other operational features are identical to those of the ASIC shown in FIG. 1.

As has been explained, the ASIC in the third embodiment, which is provided with the delay circuit 17 that delays the test data TD at the scan flipflop 10B, an advantage is achieved in that the test data TD can be latched with a high degree of reliability regardless of differences in the length of delay time achieved through the scan path 1S and the like.

While the integrated circuit according to the present invention has been particularly shown and described with respect to preferred embodiments thereof by referring to the attached drawings, the present invention is not limited to these examples and it will be understood by those skilled in the art that various changes in form and detail may be made therein without departing from the spirit, scope and teaching of the invention.

For instance, while in the ASIC in FIG. 4, three user logic circuits such as the user logic circuit 1 and the like are provided, the number of user logic circuits is not limited to three and an arbitrary number of user logic circuits may be provided, with scan flipflops 10 provided between the individual user logic circuits 1 and so forth.

In addition, while each of the user logic circuits such as the user logic circuit 1 is connected with one input signal line and one output signal line, the number of input/output signal lines is arbitrary, as long as a scan flipflop 10 or the like is provided for each input/output signal line between the individual user logic circuits such as the user logic circuit 1 and the number of selectors 6 provided corresponds to the number of output signals OUT.

Moreover, while the flipflops 11 and 14 latch the data at a rise of the clock signal CK rises, they may latch the data at the fall of the clock signal CK instead.

Moreover, while the delay circuits 16 and 17 are each constituted of an even number of inverters, they may assume any structure as long as they achieve a specific length of delay time.

As has been explained in detail, in one aspect of the present invention, a first flipflop that latches an input signal when the clock signal has shifted from a first level to a second level and a second flipflop that latches an output signal from the first flipflop when the clock signal has shifted from the second level to the first level are provided. Thus, since the input signal in the test mode can be latched with a high degree of reliability regardless of the length of delay achieved through the transmission path of the input signal, an integrated circuit with an added scanning function can be constituted without having to take into consideration the timing used in the test mode.

In addition, in another aspect of the present invention, a delay circuit for latching an input signal by delaying the clock signal is provided. With this, an advantage similar to that achieved in the first aspect of the present invention is achieved.

Furthermore, in yet another aspect of the present invention, a delay circuit is provided to delay an input signal so that it can be latched in conformance to the clock signal. With this, an advantage similar to that achieved in the first aspect of the present invention is achieved.

The entire disclosure of Japanese Patent Application No.9-70088 filed on Mar. 24, 1997 including specification, claims, drawings and summary is incorporated herein by reference in its entirety.

What is claimed is:

1. An integrated circuit comprising:

logic circuits provided at N stages, wherein N is a numeral of at least two, and wherein each of said logic circuits performs a specific logic operation in response to a provided input signal and outputs an output signal for a logic operation to be performed at a succeeding stage thereof;

N-1 means for latching having a scanning function respectively provided between individual stages of said logic circuits provided at N stages, wherein each of said means for latching receives an input signal of a logic circuit at a preceding stage and an output signal from said logic circuit at said preceding stage, and wherein each of said means for latching latches said output signal from said logic circuit at said preceding stage based upon a clock signal having a first level and a second level and outputs said output signal as an input signal of a logic circuit at said succeeding stage when a non-test mode is set, and wherein each of said means for latching latches and outputs said input signal of said logic circuit at said preceding stage in conformance to said clock signal when a test mode is set;

time hold correction circuits each provided at each of said means for latching having a scanning function to perform a latching operation and an output operation using different timing sequences; and a means for selection that is provided with an input signal for a logic circuit at an Nth stage and an output signal from said logic circuit, selects and outputs said output signal when said non-test mode is set and selects and outputs said input signal when said test mode is set.

2. An integrated circuit comprising:

logic circuits provided at N stages, wherein N is a numeral of at least two, and wherein each of said logic circuits performs a specific logic operation in response to a provided input signal and outputs an output signal for a logic operation to be performed at a succeeding stage thereof;

N-1 means for latching having a scanning function respectively provided between individual stages of said logic circuits provided at N stages, wherein each of said means for latching receives an input signal of a logic circuit at a preceding stage and an output signal from said logic circuit at said preceding stage, and wherein each of said means for latching latches said output signal from said logic circuit at said preceding stage based upon a clock signal having a first level and a second level and outputs said output signal as an input signal of a logic circuit at said succeeding stage when a non-test mode is set, and wherein each of said means for latching latches and outputs said input signal of said logic circuit at said preceding stage in conformance to said clock signal when a test mode is set;

time hold correction circuits each provided at each of said means for latching having a scanning function to perform a latching operation and an output operation using different timing sequences; and a means for selection that is provided with an input signal for a logic circuit at an Nth stage and an output signal from said logic circuit, selects and outputs said output signal when said non-test mode is set and selects and outputs said input signal when said test mode is set;

wherein said time hold correction circuits each comprises:
- a first flip-flop that latches said input signal for said logic circuit at said preceding stage when said clock signal has shifted from said first level to said second level;
- a selector that is provided with said output signal from said logic circuit at said preceding stage and an output signal from said first flip-flop, selects and outputs said output signal from said logic circuit at said preceding level when said non-test mode is set and selects and outputs said output signal from said first flip-flop when said test mode is set; and
- a second flip-flop that latches an output signal from said selector when said clock signal has shifted from said second level to said first level and outputs said output signal as an input signal of said logic circuit at said succeeding stage.

3. An integrated circuit comprising:

logic circuits provided at N stages, wherein N is a numeral of at least two, and wherein each of said logic circuits performs a specific logic operation in response to a provided input signal and outputs an output signal for a logic operation to be performed at a succeeding stage thereof;

N-1 means for latching having a scanning function respectively provided between individual stages of said logic circuits provided at N stages, wherein each of said means for latching receives an input signal of a logic circuit at a preceding stage and an output signal from said logic circuit at said preceding stage, and wherein each of said means for latching latches said output signal from said logic circuit at said preceding stage based upon a clock signal having a first level and a second level and outputs said output signal as an input signal of a logic circuit at said succeeding stage when a non-test mode is set, and wherein each of said means for latching latches and outputs said input signal of said logic circuit at said preceding stage in conformance to said clock signal when a test mode is set;

time hold correction circuits each provided at each of said means for latching having a scanning function to perform a latching operation and an output operation using different timing sequences; and a means for selection that is provided with an input signal for a logic circuit at an Nth stage and an output signal from said logic circuit, selects and outputs said output signal when said non-test mode is set and selects and outputs said input signal when said test mode is set;

wherein said time hold correction circuits each comprises:
- a delay circuit that outputs a delayed clock signal achieved by delaying said clock signal by a specific length of time;
- a first flip-flop that latches said input signal of said logic circuit at said preceding stage based upon said delayed clock signal;
- a selector that is provided with said output signal from said logic circuit at said preceding stage and an output signal from said first flip-flop, selects and outputs said output signal from said logic circuit at said preceding stage when said non-test mode is set and selects and outputs said output signal from said first flip-flop when said test mode is set; and
- a second flip-flop that latches an output signal of said selector in conformance to said clock signal and outputs said output signal as an input signal of said logic circuit at said succeeding stage.

4. An integrated circuit according to claim 3, wherein a length of delay time achieved by said delay circuit is larger than a clock skew value.

5. An integrated circuit comprising:

logic circuits provided at N stages, wherein N is a numeral of at least two, and wherein each of said logic circuits performs a specific logic operation in response to a provided input signal and outputs an output signal for a logic operation to be performed at a succeeding stage thereof;

N-1 means for latching having a scanning function respectively provided between individual stages of said logic circuits provided at N stages, wherein each of said means for latching receives an input signal of a logic circuit at a preceding stage and an output signal from said logic circuit at said preceding stage, and wherein each of said means for latching latches said output signal from said logic circuit at said preceding stage based upon a clock signal having a first level and a second level and outputs said output signal as an input signal of a logic circuit at said succeeding stage when a non-test mode is set, and wherein each of said means for latching latches and outputs said input signal of said logic circuit at said preceding stage in conformance to said clock signal when a test mode is set;

time hold correction circuits each provided at each of said means for latching having a scanning function to perform a latching operation and an output operation using different timing sequences; and a means for selection that is provided with an input signal for a logic circuit at an Nth stage and an output signal from said logic circuit, selects and outputs said output signal when said non-test mode is set and selects and outputs said input signal when said test mode is set;

wherein said time hold correction circuits each comprises:

a delay circuit that outputs a delayed input signal achieved by delaying said input signal for said logic circuit at said preceding stage by a specific length of time;

a selector that is provided with said output signal from said logic circuit at said preceding stage and said delayed input signal, selects and outputs said output signal from said logic circuit at said preceding stage when said non-test mode is set and selects and outputs said delayed input signal when said test mode is set; and a flip-flop that latches an output signal from said selector in conformance to said clock signal and outputs said output signal as an input signal of said logic circuit at said succeeding stage.

6. An integrated circuit according to claim 5, wherein a length of delay time achieved by said delay circuit is larger than a clock skew value.

* * * * *